United States Patent
Huang et al.

(10) Patent No.: US 7,511,936 B2
(45) Date of Patent: Mar. 31, 2009

(54) METHOD AND APPARATUS FOR DYNAMIC PLASMA TREATMENT OF BIPOLAR ESC SYSTEM

(75) Inventors: Cuker Huang, Banciao (TW);
Shing-Long Lee, Hsin hu (TW); Yi-Jou Lu, Hsinchu (TW); Chia-Ling Lee, Keelung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 358 days.

(21) Appl. No.: 11/425,006

(22) Filed: Jun. 19, 2006

(65) Prior Publication Data
US 2007/0019360 A1    Jan. 25, 2007

Related U.S. Application Data

(60) Provisional application No. 60/700,731, filed on Jul. 20, 2005.

(51) Int. Cl.
*H02N 13/00* (2006.01)
(52) U.S. Cl. .................................................. 361/234
(58) Field of Classification Search ........... 361/234
See application file for complete search history.

(56) References Cited

U.S. PATENT DOCUMENTS

| | | | |
|---|---|---|---|
| 5,350,479 A | 9/1994 | Collins et al. | |
| 5,473,291 A | 12/1995 | Brounley | |
| 5,679,606 A | 10/1997 | Wang et al. | |
| 5,790,365 A * | 8/1998 | Shel | 361/234 |
| 5,874,361 A | 2/1999 | Collins et al. | |
| 5,880,922 A | 3/1999 | Husain | |
| 5,946,184 A | 8/1999 | Kanno et al. | |
| 5,980,768 A | 11/1999 | Abraham | |
| 6,096,161 A | 8/2000 | Kim et al. | |
| 6,114,182 A | 9/2000 | Tabara | |
| 6,115,232 A * | 9/2000 | Hass et al. | 361/234 |
| 6,423,653 B1 | 7/2002 | Fu et al. | |
| 6,503,410 B1 | 1/2003 | Blalock et al. | |
| 6,535,785 B2 | 3/2003 | Johnson et al. | |
| 6,537,421 B2 | 3/2003 | Drewery | |
| 6,713,406 B1 | 3/2004 | Fu et al. | |
| 6,790,375 B1 | 9/2004 | Howald et al. | |
| 6,794,301 B2 | 9/2004 | Savas | |
| 6,847,516 B2 | 1/2005 | Kwon et al. | |
| 6,879,870 B2 | 4/2005 | Shannon et al. | |
| 6,905,626 B2 | 6/2005 | Westerman et al. | |
| 7,218,503 B2 * | 5/2007 | Howald | 361/234 |
| 2003/0236004 A1 | 12/2003 | Sung et al. | |
| 2004/0031699 A1 | 2/2004 | Shoji | |
| 2005/0103444 A1 | 5/2005 | Brcka | |

OTHER PUBLICATIONS

Lam Research Corporation, "TCP Design", at http://www.Iamrc.com/topnav.cfm?db=1&section=3&subsection=1&subsection=1&br . . . Jun. 15, 2005, 2 pages.
Oxford Instruments, "electrostatic chuck (ESC)", at file://C:\Documents and Settings\Iig100\Local Settings\Temporary Internet Files\OLK50\w . . . Jun. 15, 2005, 2 pages.
US 5,761,471, 06/1998, Burkhart (withdrawn)*

* cited by examiner

*Primary Examiner*—Ronald W Leja
(74) *Attorney, Agent, or Firm*—Duane Morris, LLP

(57) ABSTRACT

The disclosure generally relates to a method for method for plasma etching a substrate in a plasma reactor comprising positioning the substrate on an electrostatic chuck inside the plasma reactor; supplying a DC voltage to the chuck, the DC voltage forming an electrostatic charge buildup on the substrate; plasma etching the substrate; disconnecting the DC voltage to the chuck; and counteracting the electrostatic charge buildup on the substrate by discharging a varying RF signal within the chamber.

27 Claims, 7 Drawing Sheets

102  101

101

METHOD AND APPARATUS FOR DYNAMIC PLASMA TREATMENT OF BIPOLAR ESC SYSTEM

The instant application claims the filing-date benefit of Provisional Application No. 60/700,731, filed Jul. 20, 2005, the specification of which is incorporated herein in its entirety.

Semiconductor integrated circuit microelectronics fabrications are formed by depositing metallic lines in complex topographical patterns on semiconductor substrates. As fabrication integration levels have increased and integrated circuit device and patterned conductor layer dimensions have decreased, the spacing between adjacent lines have also decreased. An important challenge when depositing dielectric layers is to provide void-less gapfill capability over high aspect ratio. Another challenge is to deposit the metallic lines or other layers on the substrate with the due precision.

To address these needs, conventional methods use vacuum plasma processors and electrostatically-charged chucks for maintaining the substrate in position. Conventional plasma processors typically include a vacuum chamber having a chuck for securing the substrate. The substrate is positioned atop a surface of the chuck where it is subjected to plasma etching and other plasma deposited. The etching and depositing are implemented by low impedance plasma formed from one or more gasses into the plasma chamber while applying an RF field to the gas. Other gasses can be introduced to the chamber to act as, for example, a heat transfer medium and improve thermal conductivity of the chamber. To prevent any movement of the substrate during processing, the substrate must be secured to the chuck such that the pressure of the heat transfer gas would not move the substrate. Conventionally, the substrate is secured to the chuck through an electrostatic force. Namely, the chuck is energized with DC voltage to build electrostatic charge thereon. To the extent that the substrate is typically a semiconductor material, the electrostatic charge is transferred from the chuck to the surface of the substrate.

In such systems, the unbalanced charge distribution results from the ion counteraction when a bipolar electrostatic chuck is used. That is, an overload discharge counteracting current will occur at the connecting bridge located between two metal boards. The overload will induce a fracture in the metal line. Moreover, if the film thickness is not great enough to absorb or suppress the energy, an exploding force may occur between the metal boards breaking the metal line. This defect is called micro-arcing.

Micro-arcing typically occurs when removing or de-chucking the substrate from an electrostatically charged chuck. To address micro-arcing, a conventional technique calls for applying a de-chucking voltage to a monopolar electrode that has the same voltage polarity used to secure the substrate to the chuck. The de-chucking voltage has a magnitude different than the chucking voltage in order to minimize the attractive electrostatic forces between the substrate and the chuck. Pursuant to such an approach, an optimal voltage for de-chucking voltage is determined experimentally or by monitoring the amplitude of the current pulse produced as the substrate is mounted on the chuck.

Monitoring the amplitude of the current pulse is inapplicable to situations where the substrate is glass or other dielectric material. Moreover, experimental determinations of de-chucking voltage have been determined to be time-consuming, inaccurate and ineffective. Accordingly, there is a need for a method and apparatus to enable simple, effective and inexpensive de-chucking of the substrate from the plasma chuck.

SUMMARY OF THE DISCLOSURE

In one embodiment, the disclosure relates to a method for plasma etching a substrate in a plasma chamber by positioning the substrate on a chuck within the plasma chamber, the chuck can be adapted to provide a bipolar electrostatic charge to the substrate. The chuck can be charged chuck to form an electrostatic charge buildup on the substrate, Plasma etching of the substrate will then ensue. Once etching is complete, the electrostatic charge to the chuck can be removed. Any electrostatic charge buildup can be discharged according to one embodiment of the disclosure by introducing an RF signal of varying frequency within the plasma chamber.

In another embodiment, the disclosure relates to a plasma etching apparatus comprising a processing chamber having an interior area for receiving plasma. An electrostatic chuck can be positioned in the interior area of the chamber. The chuck may include a surface for receiving a wafer wherein the chuck is configured to communicate electrostatic charge to the wafer. A conductive coil can be positioned within the chamber to provide RF frequency therein. An RF source in communication with the conductive coil can provide varying RF frequency in order to neutralize the plasma environment within the processing chamber.

In still another embodiment, the disclosure relates to a method for etching a wafer in a plasma etching chamber. The method comprises providing a plasma chamber with an electrostatic chuck disposed therein. The chuck may include at least one electrode. The substrate can be positioned on the chuck or secured to the chuck vis-à-vis by electrostatic force supplied by a DC voltage source. The substrate can be etched or otherwise processed with plasma while in the chamber. Upon disconnecting the DC voltage supply to the electrode the electrostatic charge buildup can be addressed by introducing RF of varying frequency inside the chamber.

BRIEF DESCRIPTION OF THE DRAWINGS

The disclosure is described with reference to the following non-limiting and exemplary illustrations in which similar elements are numbered similarly and where:

FIG. 3C is a schematic circuit diagram depicting the circuit formed by the wafer 315 and chuck 320 when RF is turned ON;

FIG. 3D depicts neutralization process when RF is turned ON; and

DETAILED DESCRIPTION OF THE DISCLOSURE

Figure 1A:
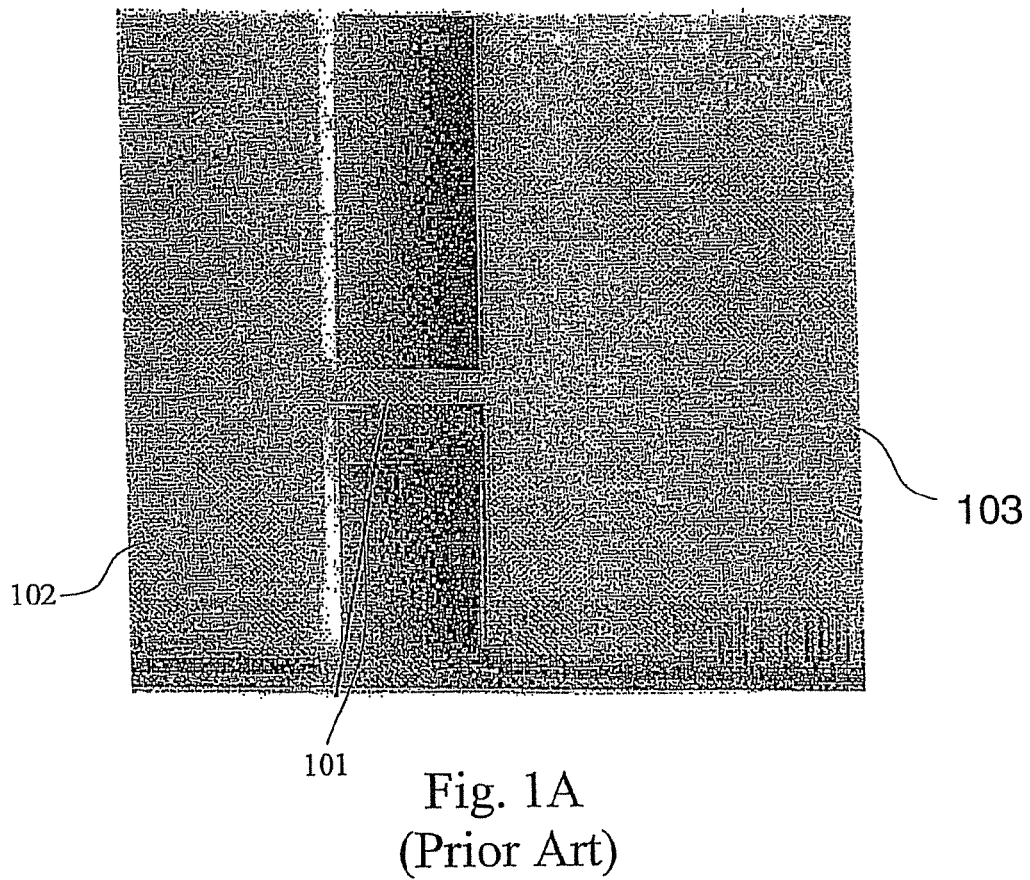
FIG. 1A shows a bridge connecting two boards on a substrate.
Figure 1B:
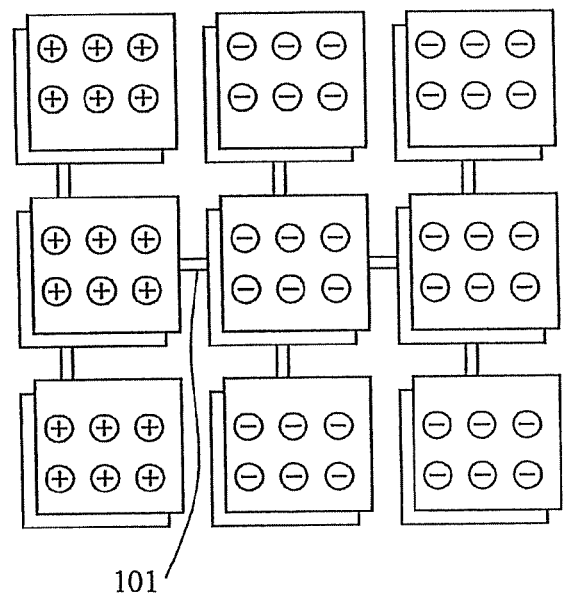
FIG. 1B schematically illustrates the charge distribution on the surface of the substrate.
Figure 1C:
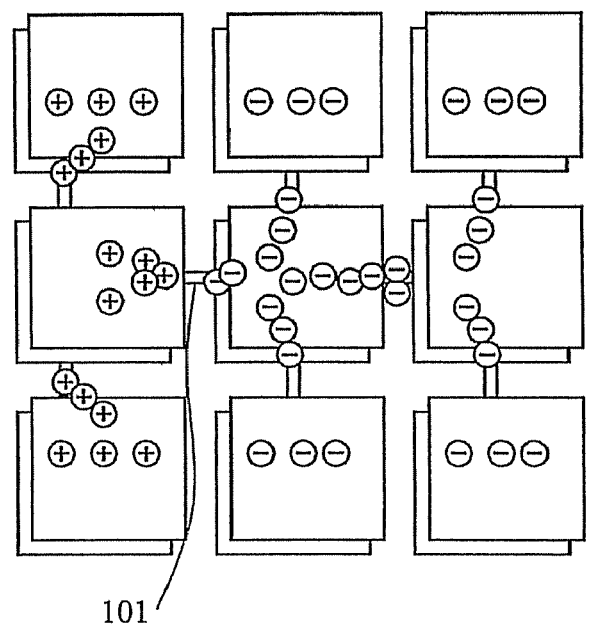
FIG. 1C shows an unbalanced charge distribution on a bridge line connecting two boards.
Figure 1D:
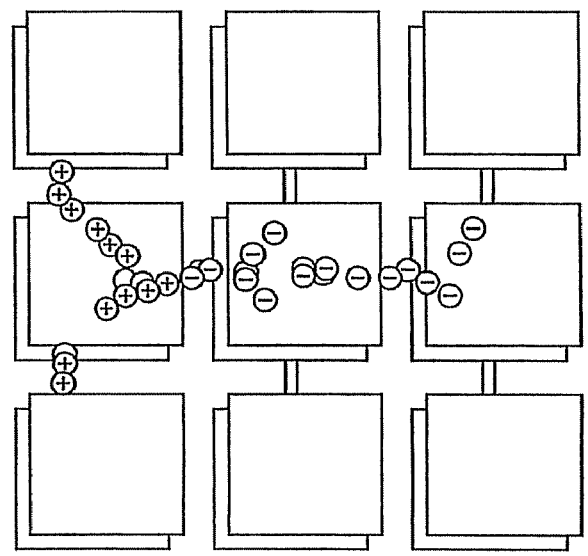
FIG. 1D schematically shows an unbalanced distribution that results once the electrostatic discharge is removed from the chuck.
Figure 1E:
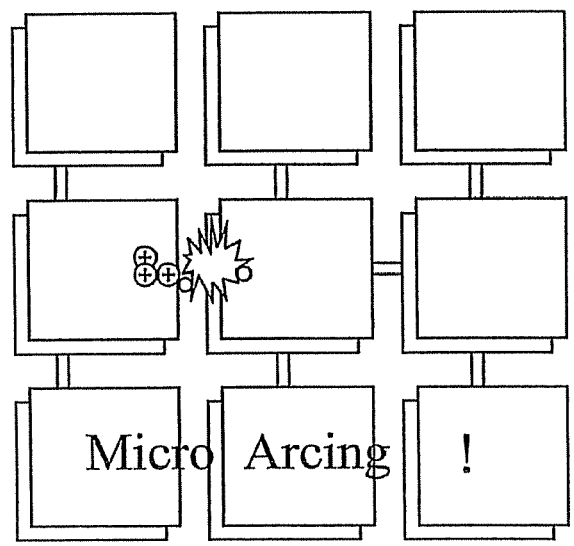
FIG. 1E schematically shows micro-arcing on the bridge between two metal boards.
Figure 1F:
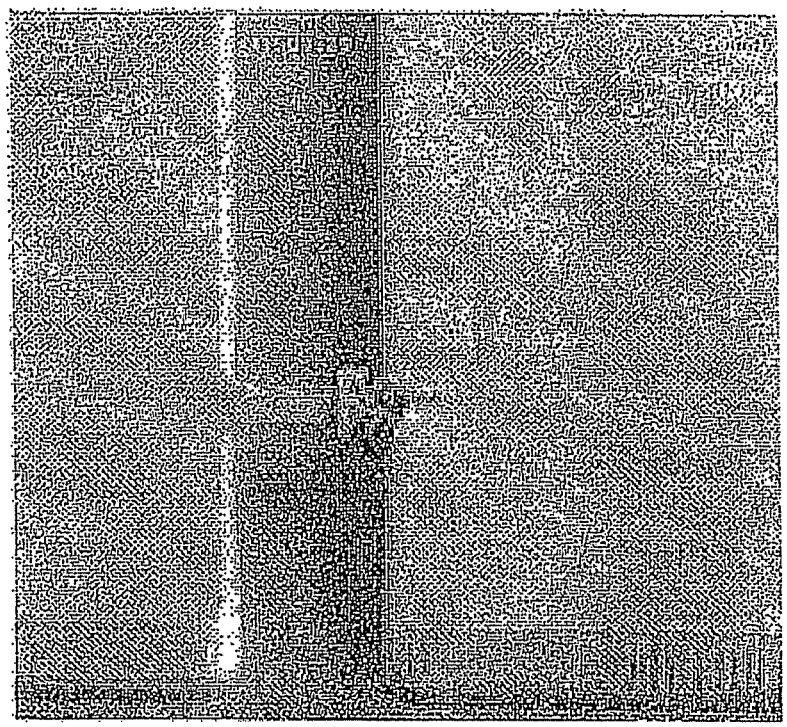
FIG. 1F shows the defect caused by micro-arcing illustrated in FIG. 1E.

FIGS. 1A-1F schematically illustrate the bipolar electrostatic discharge counteracting current on a substrate secured to a chuck. Specifically, FIG. 1A shows bridge 101 connecting boards 102 on a substrate. Although not shown, the substrate is secured to a chuck through an electrostatic forces. FIG. 1B schematically illustrates the charge distribution on the surface of boards 102 of the substrate, and more particularly, on the various boards connecting to each other by one or more bridges. As can be seen from FIG. 1(B), the electrostatic charges or ions are initially evenly distributed across. FIG. 1C shows an unbalanced charge distribution that results from bipolar ESC's self ion counteraction. Here, the ions aggregate on boards 102 across bridge 101. An overloaded discharge counteracting current will occur at connecting bridge 101 located between two wide metal boards 102 once the chuck is energized with ESC. FIG. 1D illustrates the situation where the electrostatic discharge is removed from the chuck. The discharge action is due to ion interaction; that is, the combination activity between positively charged and the negatively charged ions. Here all of the ions are lined up across the bridge creating a counteracting force over bridge 101. It can be seen from FIG. 1E that an overload discharge counteracting current will occur at bridge 101 causing a fracture thereon. The result of micro-arcing is shown in FIG. 1F.

As shown in FIGS. 1A-1F, micro-arcing is caused by the overload of electrostatic charge counteracting current. According to one embodiment of the disclosure micro-arcing can be eliminated by relaxing the overload current at the substrate. Relaxing the overload current can be accomplished according to one embodiment of the disclosure by providing a vertical relaxation path through the plasma environment. This can be done, for example, by dynamically triggering source RF while electrostatic charge is shutting off to thereby shroud the process chamber in a neutral plasma environment. The neutral plasma can provide a release path for the charged substrate and to the counteracting ions to thereby prevent micro-arcing.

Figure 2:
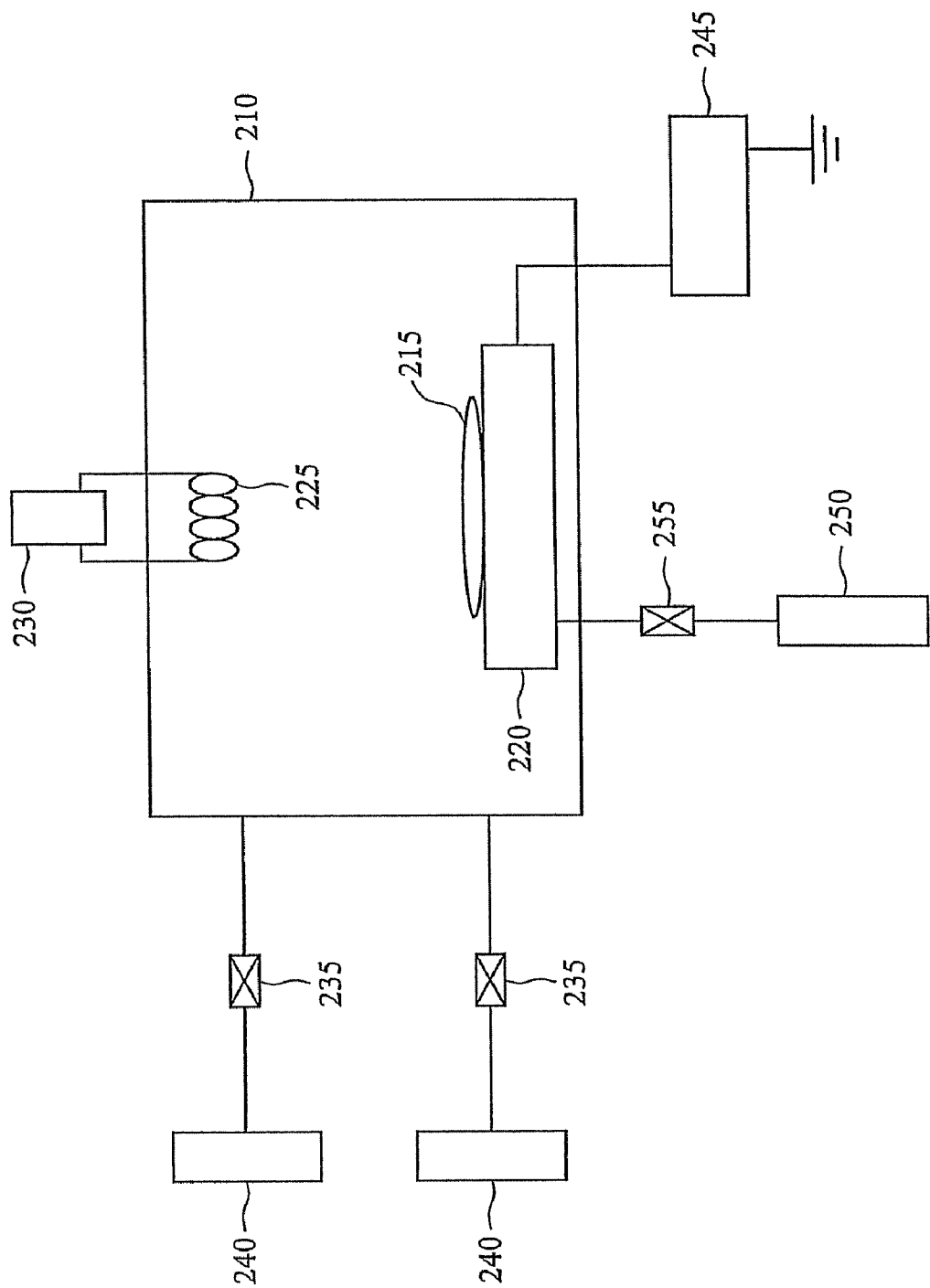
FIG. 2 is a schematic representation of an apparatus according to an embodiment of the disclosure.

FIG. 2 is a schematic representation of an apparatus according to an embodiment of the disclosure. In FIG. 2, plasma chamber 210 includes electrostatic chuck 220 and substrate 215 positioned thereon. Electrostatic chuck 220 communicates with energy source 245. The energy source may include, for example, a DC voltage source, a bipolar high voltage source or any similar device adapted to provide an electrostatic charge to chuck 220. One or more noble gasses can be provided from gas sources 240 to plasma chamber 210 through valves 235. The gas source and delivery system shown in FIG. 2 are exemplary in nature the inventive embodiment is not limited to only one gas source and delivery. Further, while not shown, gas source 240 and valve 235 can be coupled to a controller having a processor programmed with instructions to meter gas into chamber 210. Gas source 250 communicates with electrostatic chuck 220 via valve 255. Gas source 250 may define one or more gasses adapted to provide a heat transfer medium. Placement or application of such gasses are optional.

As stated, electrostatic chuck 220 communicates with source 245. Source 245 can comprise a power source coupled to a controller having one or more processor programmed with instructions for supplying power to chuck 220. In one embodiment, the processors are programmed with instructions to provide a finite voltage for a predetermined duration to chuck 220. The processors may also be programmed to provide a voltage of varying magnitude to chuck 220.

In the exemplary embodiment of FIG. 2, plasma chamber 210 also includes coil 225. Coil 225 can be configured to provide an RF signal controlled by RF source 230. RF source 230 may include a control system (not shown). According to one embodiment of the disclosure, RF source 230 can be configured to supply an RF signal of varying frequency to coil 225. In another embodiment, RF source 230 energizes coil 225 with a continuous RF signals having frequency that changes over time. In still another embodiment, RF source 230 energizes coil 225 with RF signal pulses. Each pulse may have the same or different duration than previous pulses. In addition, each pulse may have a similar or different amplitude or frequency from previous pulses.

In one embodiment, coil 225 is charged substantially simultaneously with discharging of the chuck 220. That is, simultaneous with shutting the energy source 245 to chuck 220, the coil 225 is charged with RF of varying frequency. In another embodiment, the energy supply to chuck 220 is disconnected prior to energizing coil 225. According to either embodiment, the supply of RF energy to coil 225 counteract the electrostatic charge buildup in the plasma environment of chamber 210. Thus, by dynamic triggering source RF while the electrostatic chuck is shutting off (or has turned off) a neutral plasma environment shrouds the process chamber to provide a second charge release path to the counteracting ions.

Figure 3A:
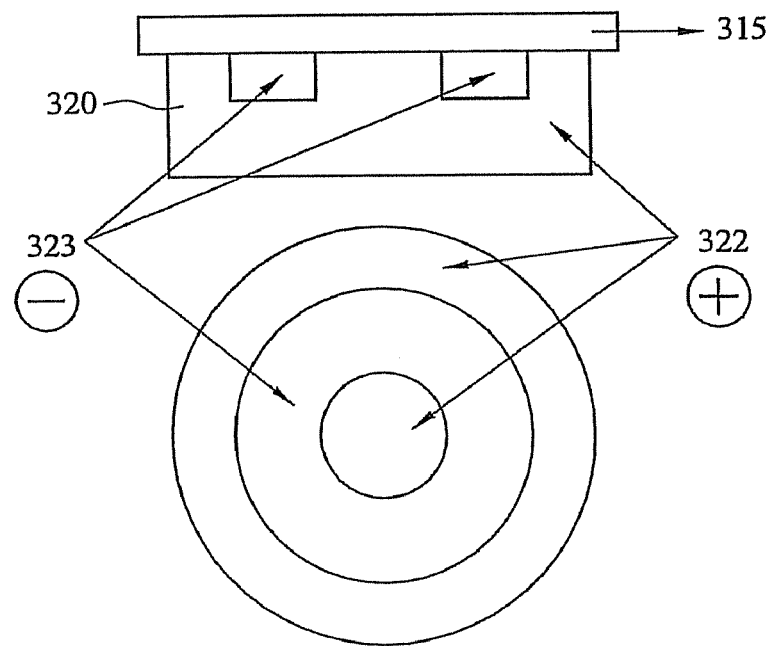
FIG. 3A is a schematic representation of an exemplary chuck and wafer according to one embodiment of the disclosure.

FIG. 3A is a schematic representation of an exemplary chuck and wafer according to one embodiment of the disclosure. The chuck and wafer combination shown in FIG. 3A can be positioned in a plasma chamber as shown in FIG. 2. Referring to FIG. 3A wafer 315 is positioned atop chuck 320. In the exemplary embodiment of FIG. 3A, chuck 320 comprises concentric circles 322 and 323, forming a bipolar electrostatic chuck. Each group of circles is charged with a different electrostatic polarity by a source (not shown). For example, concentric circles 323 (donut) can be charged to form a negative electrode on the base of chuck 320, while circles 322 (base) can be charged with a positive charge to form a cathode electrode on the base of chuck 320. Substrate 315 can be positioned adjacent or in contact with the base of chuck 320.

Figure 3B:
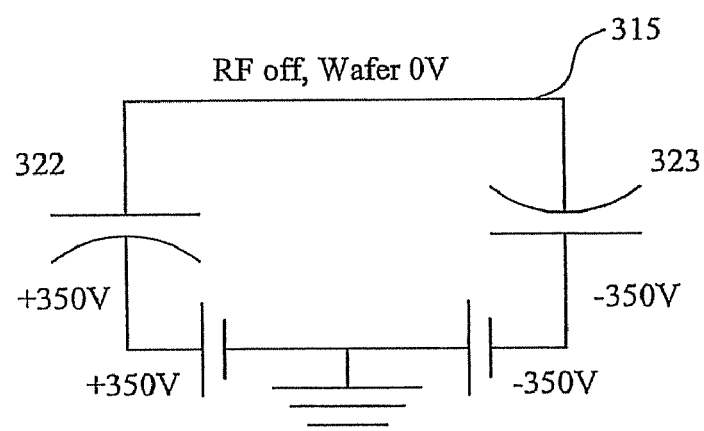
FIG. 3B is a schematic circuit diagram depicting the circuit formed by the wafer 315 and chuck 320 when RF is turned OFF.
Figure 3C:
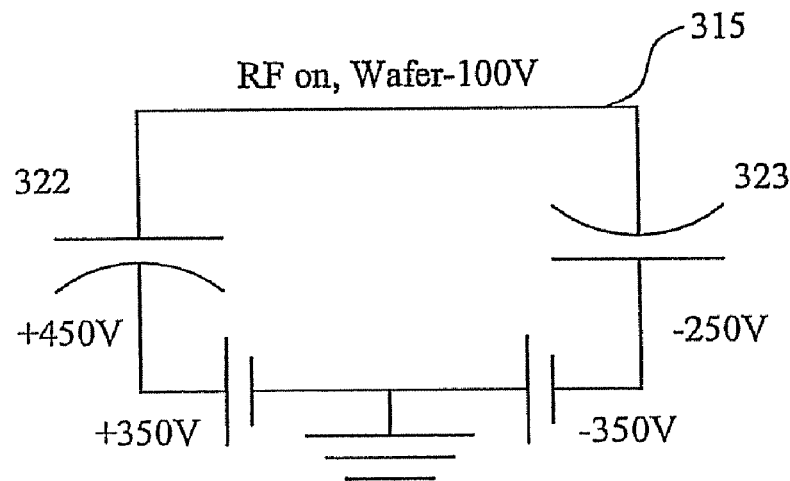

FIG. 3B is a schematic circuit diagram depicting the circuit formed by the wafer 315 and chuck 320 when RF is turned off. The voltage at the surface of the substrate 315 is zero when RF is off. Here the cathode electrode 322 of chuck 320 (see FIGS. 2 and 3A) is charged to 350 V while the anode electrode 323 of chuck 320 is charged with −350 V. The net result to the wafer is 0V. During the etching process, negative ions are attracted to the positive ions of the base and enhance polymer deposition. In the mean time, positive ions are repelled from the base electrode and form a negative voltage of about −100 V on the wafer's surface. The negative voltage strength has a reverse ratio to the attached polymer. Generally, thicker polymer can be corresponding to the lower volt age of wafer surface. In addition, oxide etching rate decreases in relation to an increased polymer thickness. In FIG. 3C, the RF is ON and the wafer is charged to −100V based on the cathode and anode electrodes delivering, respectively, +450V and −250V to the wafer.

Figure 3D:
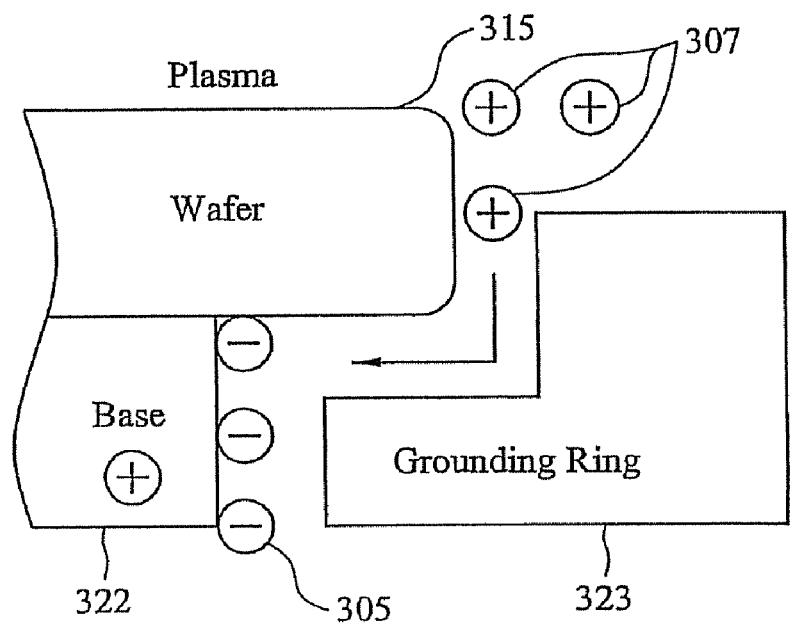

FIG. 3D schematically represents neutralization process when the RF is turned ON. Referring to FIG. 3D, wafer 315 is positioned atop of chuck 320 (not entirely shown) in a plasma chamber (not shown). The wafer is in contact with the cathode electrode at the base 322 of chuck 320 and is positively charged. Electrode 323 is grounded. Negative ions 305 flock to base 322 to counteract the positively charged base. In accordance with one embodiment of the disclosure, once the RF signal is introduced in the plasma chamber (not shown) neutralizing ions 307 are introduced in the plasma environment which counteract the negatively charged ions 305. Thus, RF of varying frequency counteracts the electrostatic charge to cause neutralization.

The arrow between the positive and negative ions are crossed out in FIG. 3D. The positive ions 307 are repelled by positive ESC base 322 and deposit polymer on the surface of grounding ring 323. On the other side, the negative ions 305 are attracted and neutralized by positive ESC base 322 and deposits polymer onto the surface of ESC base. Therefore, the polymer on the side of ESC base adds thickness. The thicker polymer reduces the force of repellence and attraction. The impedance of etching path between plasma to chamber base therefore becomes higher and that will reduce the strength of ion bombard. This is one reason for the oxide etch-rate is getting lower as polymer is deposited. It can also be proportional to the damage rate of micro-arcing.

As discussed, the oxide etch rate decreases as the polymer thickness on the base increases. Wafer-less autoclean (WAC) systems are conventionally used to clean the plasma chamber by removing excess polymer. WAC also enables recovery of chamber condition from polymer contamination and maintains the strength of ion bombardment. The strength of ion bombardment is proportional to the oxide etching rate. Thus, according to one embodiment of the disclosure (i) longer WAC process provides a better ion bombardment and higher oxide etching rate; (ii) a cleaner base sidewall provides a highly negative voltage on the wafer surface; and (iii) a high electrostatic voltage on wafer surface provides a larger ESC counteracting current. The higher counteracting current may increase current overload and includes micro-arcing. Thus, according to one embodiment, micro-arcing is eliminated by: (i) reducing WAC time, (ii) shutting off ESC by reducing power in a decaying-manner; and (iii) providing a plasma relaxing path by introducing RF of varying frequency in the plasma chamber.

EXAMPLE 1

A substrate was placed on a dual bipolar plasma chamber and processed as follows: (1) Helium (He) was introduced for 15 seconds into the chamber and pressure was increased to 0.3 mT; (2) while maintaining the He flow, chloride ($Cl_2$) and trifluoromethane ($CHF_3$) were also introduced for about 30 seconds; (3) RF frequency of about 40 W was introduced; (4) RF frequency was increased to 600 W; (5) RF frequency was triggered from about 100 to 200 W from while $N_2$ and Ar gasses were introduced into the plasma environment; (6) flow of He was discontinued while shutting off ESC; and (7) shutting off the RF frequency. The steps of Example 1 are more specifically outlined at Table 1:

TABLE 1

Plasma processing according to one embodiment of the disclosure

| No | 1 | 2 | 3 | 4 | 5 | 6 | 7 |
|---|---|---|---|---|---|---|---|
| Step | BP | Stab2 | BT | ME | Neutral. | Neutral. | PD |
| Pressure (mT) | 0.3 | 12 | 12 | 12 | 12 | 12 | 10 |
| He Flow Max | 18 | 18 | 18 | 18 | 18 | 18 | 25 |
| RF upper (W) | 0 | 0 | RFbt | 600 | 100 | 100 | 0 |
| RF lower (W) | 0 | 0 | 40 | RFme | 0 | 0 | 0 |
| BCl3 | 0 | 0 | 0 | XSccm | 0 | 0 | 0 |
| Cl2 | 0 | 60 | 60 | Xsccm | 0 | 0 | 0 |
| N2 | 0 | 0 | 0 | 0 | 50 | 50 | 50 |
| Ar | 0 | 0 | 0 | 0 | 100 | 100 | 0 |
| CHF3 | 0 | 5 | 5 | 5 | 0 | 0 | 0 |
| He Clamp | 0 | 10 | 10 | 10 | 10 | 0 | 0 |
| Completion | Time | Stable | Time | Slp>= | Time | Time | Time |
| Time | 15 | 30 | Xsecs | Xsecs | 5 | 10 | 5 |

In relation to Table 1, it should be noted that there are two RF power sources in the exemplary TCP high-density plasma treatment system. The Upper RF means the top RF located at the upper electrode which is used for plasma igniting and plasma environment maintenance. Lower RF means the bottom RF which can be located at the bottom electrode. It is used for, among others, for iron bombardment to control etching strength.

Figure 4:
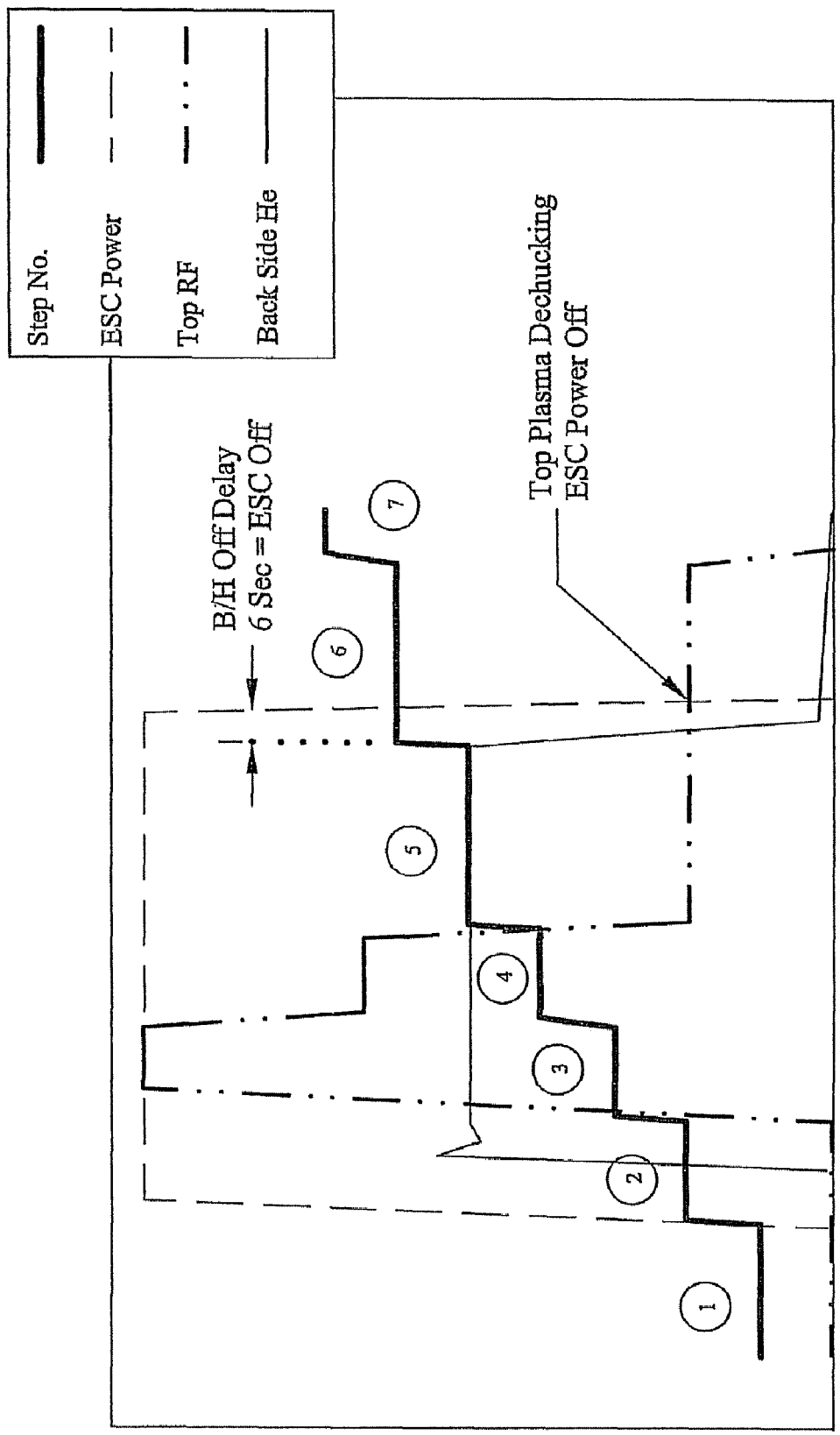
FIG. 4 graphically illustrates the steps of plasma treatment sequence according to one embodiment of the disclosure.

The results of Example 1 are graphically depicted in FIG. 4. It can be seen that bipolar a ESC (such as those shown in FIG. 3) can be discharged by ion-counteraction using RF with varying frequency as disclosed herein. In FIG. 4, Step 1 is pump down; Step 2 is the stable step; Step 3 is the break through step for TiN etch (typical step time is about 25" while in the exemplary embodiment of FIG. 4 the time is about 10"); Step 4 denotes main etch and over etch step for AlCu/bottom TiN etch (typical step time is about 70-100" while in the exemplary embodiment of FIG. 4 the time is about 10"); Step 5 is the first Ku—Lu treatment step for plasma stability; Step 6 is the second Ku—Lu treatment step for keeping top plasma environment for de-chucking; and Step 7 is the pump-down step denoting completion of the process.

The Ku—Lu treatment step is a dynamic treatment which triggers the source RF to form a neutral plasma environment. Instead of ESC's fully self-horizontal ion counteraction, the Ku—Lu environment provides a second discharging path—a vertical plasma discharge path—while the ESC is powering off. The process succeeds in counteracting current and solves the irritated micro-arcing problem. In other words, the Ku—Lu process provides a solution by dynamic triggering source RF while the ESC is shutting off and by providing a neutral plasma environment that shrouds the process within the chamber to provide a second charging release path to the counter ions. The Ku—Lu process provides a vertical plasma relaxing path which has been found to be more efficient than the conventional processes.

While the disclosure has been described in relation to certain exemplary embodiments presented herein, it should be noted that the principles of the disclosure are not limited thereto and include any modification, permutation or variation to the embodiments disclosed herein.

What is claimed is:

1. A method for plasma etching a substrate in a plasma chamber comprising:
   positioning the substrate on a chuck within the plasma chamber, the chuck adapted to provide a bipolar electrostatic charge to the substrate;
   charging the chuck to form an electrostatic charge buildup on the substrate;
   plasma etching the substrate;
   grounding the chuck; and
   counteracting the electrostatic charge buildup by discharging an RF signal of varying frequency within the plasma chamber.

2. The method of claim 1, wherein the RF signal defines a plurality of varying RF pulses.

3. The method of claim 1, wherein the RF signal defines a continuous signal.

4. The method of claim 1, further comprising the step of disconnecting a DC voltage from the chuck and substantially simultaneously discharging the RF signal.

5. The method of claim 1, further comprising the step of disconnecting a DC voltage from the chuck and sequentially discharging the RF signal.

6. The method of claim 1, further comprising measuring the electrostatic discharge buildup on the substrate.

7. The method of claim 1, wherein the substrate is a wafer.

8. The method of claim 1, wherein the chuck further comprises concentric circles forming a bipolar electrostatic chuck.

9. A plasma etching apparatus comprising:
   a processing chamber for receiving plasma;
   an electrostatic chuck positioned in the interior of the chamber, the chuck defining a surface for receiving a wafer and communicating an electrostatic charge to the wafer;
   a conductive coil positioned in the interior of the chamber; and
   an RF source in communication with the conductive coil and configured to provide a varying RF frequency to neutralize plasma environment of the processing chamber.

10. The apparatus of claim 9, further comprising a plurality of conductive coils.

11. The apparatus of claim 9, where the RF frequency is maintained at a range of about 40 to 600 watts.

12. The apparatus of claim 9, wherein the RF frequency is varied for about 3-6 seconds.

13. The apparatus of claim 9, wherein the processing chamber further receives one or more noble gasses.

14. The apparatus of claim 9, a processor programmed with instructions to vary the RF frequency supplied by the RF source to the conductive coil.

15. The apparatus of claim 9, wherein the electrostatic chuck is bipolar.

16. The apparatus of claim 9, wherein the chuck further comprises concentric circles forming a bipolar electrostatic chuck.

17. A method for etching a wafer in a plasma etching chamber comprising:
   providing a plasma chamber having an electrostatic chuck with at least one electrode;
   securing a substrate on the chuck electrostatically by supplying a DC voltage to the electrode;
   processing the substrate with plasma within the chamber;
   disconnecting the DC voltage supply to the electrode; and
   counteracting an electrostatic charge buildup by discharging an RF signal having varying frequency within the plasma chamber.

18. The method of claim 17, wherein the steps of disconnecting the DC voltage supply and providing a varying RF frequency to the plasma are implemented substantially simultaneously.

19. The method of claim 17, wherein the steps of disconnecting the DC voltage supply and providing a varying RF frequency to the plasma are implemented consecutively.

20. The method of claim 17, wherein the processing step further includes etching the substrate.

21. The method of claim 17, wherein the step of providing a varying frequency to the plasma further comprises providing one or more RF pulses to the plasma.

22. The method of claim 17, wherein the step of counteracting an electrostatic charge buildup further comprises a dynamic triggering of a source to provide an RF signal to an electrode inside the plasma chamber.

23. The method of claim 17, further comprising monitoring a charge buildup on at least one of the electrode or the chuck.

24. The method of claim 17, wherein the chuck is a bipolar chuck.

25. The method of claim 17, wherein the chuck further comprises concentric circles forming a bipolar electrostatic chuck.

26. The method of claim 25, wherein each of the concentric circles is charged with a different electrostatic polarity by a source.

27. The apparatus of claim 26, wherein each of the concentric circles is charged with a different electrostatic polarity by a source.

* * * * *